United States Patent [19]

Furui

[11] Patent Number: 5,166,880
[45] Date of Patent: Nov. 24, 1992

[54] FAULT DETECTION DEVICE FOR AN AUTOMOTIVE PASSENGER PROTECTION DEVICE

[75] Inventor: Takashi Furui, Sanda, Japan

[73] Assignee: Mitsubishi Denki Kabushiki Kaisha, Tokyo, Japan

[21] Appl. No.: 794,233

[22] Filed: Nov. 19, 1991

[30] Foreign Application Priority Data

Nov. 20, 1990 [JP] Japan ................. 2-312671

[51] Int. Cl.⁵ .......................................... B60R 21/32
[52] U.S. Cl. ................................ 364/424.05; 340/436;
280/735; 180/271; 180/282; 307/10.1
[58] Field of Search ................. 364/424.05; 340/436,
340/438; 280/728, 734, 735; 180/232, 271, 280;
307/9.1, 10.1

[56] References Cited

U.S. PATENT DOCUMENTS

| | | | |
|---|---|---|---|
| 4,222,030 | 9/1980 | Yasui et al. | 280/735 |
| 4,287,431 | 9/1981 | Yasui et al. | 280/735 |
| 4,851,705 | 7/1989 | Musser et al. | 180/282 |
| 4,945,336 | 7/1990 | Itoh et al. | 280/735 |
| 4,980,573 | 12/1990 | White et al. | 180/282 |
| 4,987,316 | 1/1991 | White et al. | 307/10.1 |
| 5,045,835 | 9/1991 | Masegi et al. | 280/735 |
| 5,081,442 | 1/1992 | Ito et al. | 280/735 |

FOREIGN PATENT DOCUMENTS 47244 4/1979 Japan .
25829 2/1989 Japan .

*Primary Examiner*—Gary Chin
*Attorney, Agent, or Firm*—Sughrue, Mion, Zinn, Macpeak and Seas

[57] ABSTRACT

A fault detection device for an automotive passenger protection device includes a pair of parallel-connected squibs 4a and 4b coupled across a DC power source 1 and acceleration is sensors 3 and 5 coupled in series therewith. A diode 10 coupled across the higher voltage terminals of the two squibs, and field effect transistors 30 and 31, inserted between the non-inverting input terminal of the differential amplifier 7 and the measurement points A and A', are driven alternately by the judgment circuit 8. A resistor 20 balances the voltages at the measurement points A and A' when the normally open contacts 3b and 5b are open. When the normally open contacts 3b and 5b are open, the voltages at measurement points A and A' are supplied alternately to the differential amplifier 7, so that the failures of the two squibs can be detected individually.

4 Claims, 8 Drawing Sheets

| Vo<br>Rs | $(V_1-V_B=20V)$<br>a | $(V_1-V_B=10V)$<br>b | $(V_1-V_B=5V)$<br>c |
|---|---|---|---|
| 2 Ω | 4.0 V | 2.0 V | 1.0 V |
| 4 Ω | 8.0 V | 4.0 V | 2.0 V |

| Rs \ Vo | ($V_1-V_B=20V$) a' | ($V_1-V_B=10V$) b' | ($V_1-V_B=5V$) c' |
|---|---|---|---|
| 2 Ω | 1.0 V | 2.0 V | 2.5 V |
| 4 Ω | 5.0 V | 4.0 V | 3.5 V |

FAULT DETECTION DEVICE FOR AN AUTOMOTIVE PASSENGER PROTECTION DEVICE

BACKGROUND OF THE INVENTION

This invention relates to fault detection devices for detecting failures to acceleration sensors (G-sensors) and the starting means (squibs) of automotive passenger protection devices which detect impulses at the collision of automobiles and protect drivers and passengers by activating a passenger protection means such as an air bag and seat belt tensioner. More particularly, this invention relates to fault detection devices which is capable of individually detecting the failures of a plurality of squibs and acceleration sensors of the passenger protection devices.

Generally, the passenger protection devices such as automotive air bag system are activated when a strong impulse in excess of a predetermined magnitude is detected and the switch of an acceleration sensor is thus closed, thereby supplying a current above a predetermined level to a starting means, known as a squib, consisting of a kind of a heater (resistor). The passenger protection means is thus activated by the starting means. Then, an air bag is expanded instantaneously at the time of collision. Thus, a starter heater of a relatively small resistance value is utilized as the squib. Since failures of the circuit consisting of the acceleration sensor and the squib presents a grave danger for human lives, the circuit is continually monitored whether or not there is an abnormality with respect to the circuit voltage or the resistance value.

FIG. 10 is a circuit diagram showing a conventional fault detection device for a passenger protection device such as an automotive air bag system. This device is disclosed, for example, in Japanese Patent Publication (Kokoku) No. 61-57219.

In FIG. 10, a battery or DC power source 1 is mounted on an automobile. An ignition switch 2, which is coupled to the DC power source 1, is mechanically interlocked with the engine starter key of the automobile. A G-sensor or an acceleration sensor 3, coupled to the DC power source 1 via the ignition switch 2, consists of a resistor 3a and a normally open contact 3b. The normally open contact 3b is coupled in parallel with the resistor 3a and is closed upon detection of a collision. Squibs 4a and 4b for starting the protection operation (such as an air bag expansion operation) are coupled to the acceleration sensor 3 via a measurement point A. The squibs 4a and 4b are coupled in parallel circuit relationship. Another G-sensor or an acceleration sensor 5 is coupled at one terminal thereof to the squibs 4a and 4b via a measurement point B. The other terminal of the acceleration sensor 5 is grounded. The acceleration sensor 5 consists of a parallel circuit consisting of a resistor 5a and a normally open contact 5b.

A fault detection circuit 6 detects an occurrence of failure of the squibs 4a and 4b. The fault detection circuit 6 connects the acceleration sensors 3 and 5 and squibs 4a and 4b across the ignition switch 2 and the negative terminal of the DC power source 1. The fault detection circuit 6 consists of: a DC differential amplifier 7 coupled across the squibs 4a and 4b; and a judgement circuit 8 coupled to the output terminal of the differential amplifier 7, wherein the judgement circuit 8 is also connected across the ignition switch 2 and the negative terminal of the DC power source 1.

The differential amplifier 7 consists of: resistors 71 through 74 for adjusting the gain, and an operational amplifier 75. The resistor 71 is coupled across the measurement point A and the non-inverting input terminal of the operational amplifier 75. The resistor 72 is inserted between the ground and the non-inverting input terminal of the operational amplifier 75. The resistor 73 is inserted between the measurement point B and the inverting input terminal of the operational amplifier 75. The resistor 74 is inserted between the output terminal and the inverting input terminal of the operational amplifier 75.

An alarm lamp 9 coupled to an output terminal of the judgement circuit 8 is energized when the squibs 4a and 4b are in failure.

The operation of the fault detection device for a passenger protection device of FIG. 10 is as follows. When the ignition switch 2 is closed upon starting the automobile, the serially connected acceleration sensors 3 and 5 and the squibs 4a and 4b are supplied from the DC power source 1.

Usually, the normally open contacts 3b and 5b of the respective acceleration sensors are open, and current flows through the resistors 3a and 5a. It is necessary to limit the magnitude of the current such that no appreciable heat is generated by the squibs 4a and 4b. Thus, the resistance Rc of the resistors 3a and 5a are set above several hundred ohms. The composite effective resistance Rs of the squibs 4a and 4b is about the half of the individual resistances which are several ohms, respectively.

Across the two terminals of the squibs 4a and 4b is developed a voltage which is equal to the DC power source voltage $V_1$ times the ratio of the composite effective resistance Rs of the squibs 4a and 4b and the composite effective resistance Rc of the resistors 3a and 5a. This voltage across the squibs is as small as about 10 mV. Thus, the differential amplifier 7 amplifies the voltage across the squibs 4a and 4b up to an easily measurable level and supplies the amplified output to the judgement circuit 8.

The judgement circuit 8 turns off the alarm lamp 9 when the resistances of the squibs 4a and 4b are normal, and turns the alarm lamp 9 on when an abnormality is detected upon failure, notifies the driver of an occurrence of abnormality.

On the other hand, in the case where the automobile is involved in a collisiion accident while the acceleration sensors 3 and 5 and the squibs 4a and 4b are functioning normally, the normally open contacts 3b and 5b are closed and the resistors 3a and 5a are thereby short-circuited. Thus, a large current is supplied to the squibs 4a and 4b. The heat thus generated by the squibs 4a and 4b starts the air bag expansion to protect the driver of the automobile. Under this circumstance, however, the failures of the acceleration sensors 3 and 5 cannot be detected.

FIG. 11 is a circuit diagram showing a conventional fault detection device for detecting an occurrence of failure of an acceleration sensor of a passenger protection device. The circuit is described, for example, in Japanese Patent Publication (Kokoku) No. 64-2537. The parts 1 through 5 and 8 and 9 are similar to those of FIG. 10 described above. It is noted however, that a single squib 4 is inserted between the acceleration sensors 3 and 5. The terminal voltages $V_A$ and $V_B$ of the respective acceleration sensors 3 and 5 coupled to the respective terminals of the squib 4 are directly applied to the judgement circuit 8.

A resistor 13 is inserted between the measurement point A of the acceleration sensor 3 and the squib 4 and the ground or the negative terminal of the DC power source 1. A resistor 14 is inserted between the measurement point B of the squib 4 and the acceleration sensor 5 and the positive terminal of the DC power source 1.

In the case of the circuit of FIG. 11, provided that the resistances of the two resistors 13 and 14 are equal to each other, the voltage at the measurement points A and B are half the DC power source voltage. If, however, one of the acceleration sensors 3 and 5 becomes abnormal and the resistance thereof changes, the voltages $V_A$ and $V_B$ at the measurement points A and B changes accordingly. Thus, upon detection of an abnormality, the judgement circuit 8 energizes the alarm lamp 9 immediately.

The above conventional fault detection devices, however, have the following disadvantages. Namely, since, in the case of the device of FIG. 10, the voltages at the two terminals A and B of a plurality of parallel-connected squibs 4a and 4b are monitored by the fault detection device, failures of individual squibs cannto be distinguished. Further, a small variation of the low voltage developed across the squibs caused by failures must be detected. Thus the gain of the differential amplifier 7 must be set at a large value, as a result, the fault detection device is easily affected by noises. Still further, since the reference level of the output of the differential amplifier 7 is the ground level, the amplified output is not determined when the squibs are operating normally, the errors such as offsets being included in the output.

In the case of the fault detection device of FIG. 11, the abnormality of the acceleration sensors are detected on the basis of the respective terminal voltages of the acceleration sensors 3 and 5. It is not possible, however, to monitor the resistances individually and to distinguish the occurrences of failures of a plurality of acceleration sensors.

SUMMARY OF THE INVENTION

It is therefore an object of this invention to provide a fault detection device for a passenger protection device enhanced in reliability which is capable of precisely detecting small voltages across the terminals of the respective squibs and of distinguishing the individual failures.

The above object is accomplished in accordance with the principle of this invention by a fault detection device for an automotive passenger protection device, comprising: a DC power source; first and second starting means each including a resistor coupled in parallel circuit relationship to each other, said first and second starting means being coupled across said DC power source; at least one accelertion sensor coupled in series with said first and second starting means and including: an acceleration sensor resistor having a resistance greater than a resistance of a resistor of said first and second starting means; and a normally open contact coupled in parallel with said first resistor; wherein said normally open contact is closed upon detection of an impulse above a predetermined magnitude, thereby supplying a current above a predetermined level from said DC power source to said first and second starting means to start a passenger protection device; a differential amplifier having a non-inverting input terminal and an inverting input terminal coupled across said first and second starting means; a judgement circuit means coupled to an output of said differential amplifier for determining an occurrence of failure of said first and second starting means on the basis of an amplified output voltage of said differential amplifier; a diode having an anode and a cathode coupled across respective higher voltage terminals of said first and second starting means; a second resistor having a resistance equal to the resistance of said first resistor, said second resistor being inserted across a positive terminal of said DC power source and the cathode of said diode; first and second switching means inserted respectively between the respective higher voltage terminals of said first and second starting means and the non-inverting input terminal of said differential amplifier; and means for alternately turning on said first and second switching means, such that the non-inverting input terminal of said differential amplifier is supplied alternately with a voltage from respective higher voltage terminals of first and second starting means.

Thus, when said normally open contact of said acceleration sensor is open, distinct small currents are supplied respectively to said first and second starting means via said first and second resistors; and when said normally open contact is closed, currents above a predetermined level are supplied directly or via the diode to the first and second starting means.

Preferably the fault detection device further comprises: a first and a second reference resistor coupled in series across the positive terminal of said DC power source and lower voltage terminals of said first and second starting means, said first and second reference resistors having a resistance ratio equal to a resistance ratio of the resistance of said acceleration sensor resistor and a resistance of a resistor of said first and second starting means, a junction point between said first and second reference resistors being coupled to the inverting input terminal of said differential amplifier. Thus, said first and second reference resistors thereby constitute a Wheatstone bridge circuit together with said first resistor and said first and second starting means. Further, said differential amplifier preferably includes an operational amplifier and a reference voltage source means coupled across the non-inverting input terminal of said operational amplifier and a ground, such that an amplified output voltage of said differential amplifier is equal to a predetermined reference voltage when input voltage difference across the non-inverting input terminal and the inverting input terminal of said differential amplifier is null.

Still preferably, the passenger protection device comprises: a third switching means inserted across said junction point between said first and second reference resistors and the non-inverting input terminal of said differential amplifier; and means for alternately turning on said first, second, and third switching means, such that said first, second and third switching means are turned on successively at distinct timings; wherein said judgment circuit includes means for canceling out an offset component on the basis of an amplified output voltage of said differential amplifier outputted when said third switching means is turned on.

It is further preferred that the fault detection device comprises at least two acceleration sensors coupled in series with said first and second starting means, a first of said two acceleration sensors, said first and second starting means, and a second of said acceleration sensors being coupled in series across the positive terminal and the negative terminal of said DC power source in order; and that the fault detection device further comprises: a second diode inserted in a forward polarity between a lower voltage terminal of said first acceleration sensor and a higher voltage terminal of said first starting means; a third diode inserted in a forward polarity between a lower voltage terminal of first and second starting means and the negative terminal of said DC power source; a pair of resistors having a resistance equal to a resistance of a resistor of said first acceleration sensor and inserted respectively across a cathode of said second and third diodes and the positive terminal of said DC power source; a pair of resistors having a resistance equal to a resistance of a resistor of said second acceleration sensor and inserted respectively across an anode of said second and third diodes and the negative terminal of said DC power source; wherein said judgment circuit means is supplied with a first measurement point voltage at the anode of said second diode and with a second measurement point voltage the cathode of said third diode such that an occurrence of failure of said first and second acceleration sensors are detected individually on the basis of said first and second measurement point voltages.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
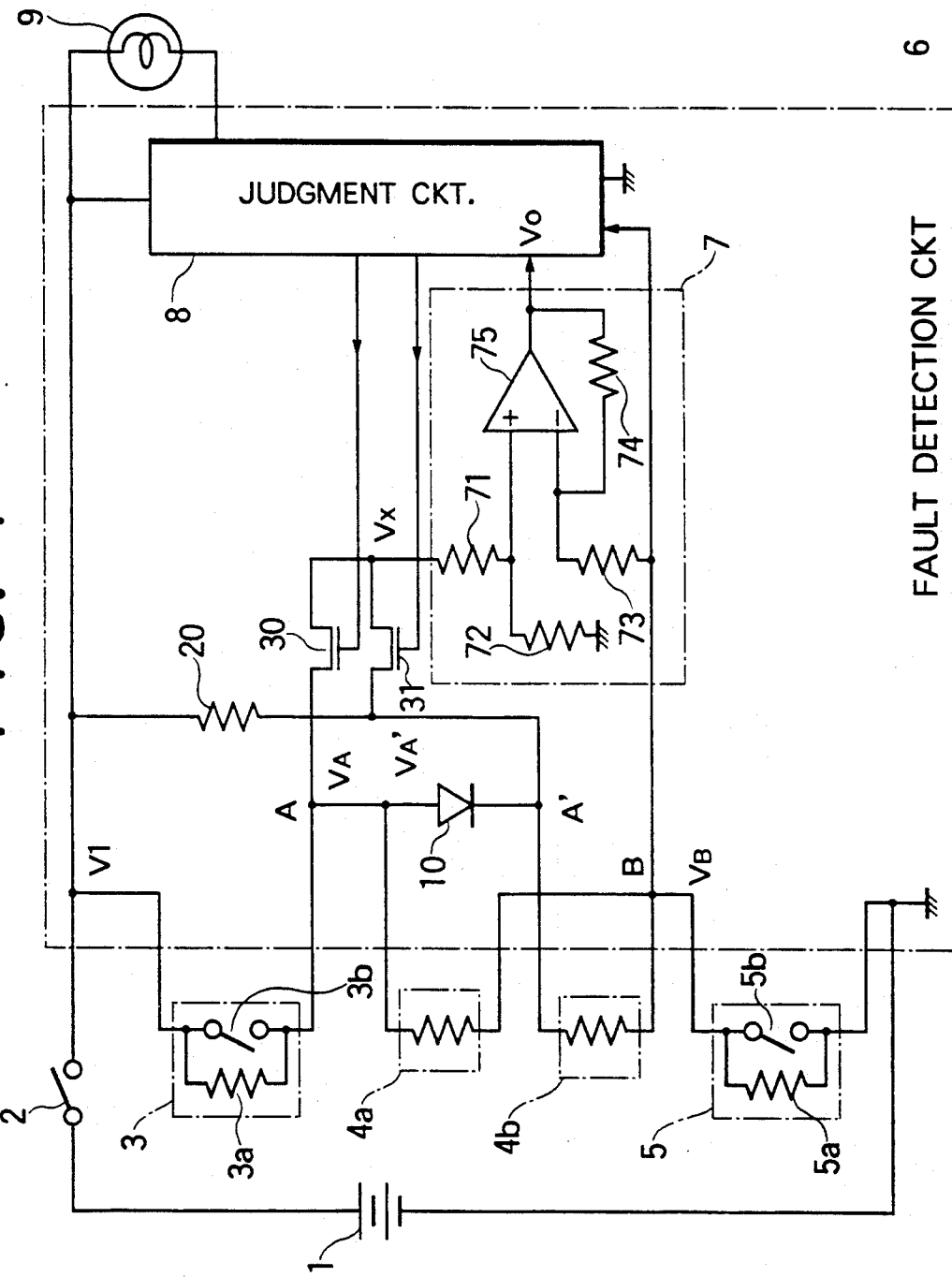
FIG. 1 is a circuit diagram showing an embodiment according to a first aspect of this invention.
Figure 10:
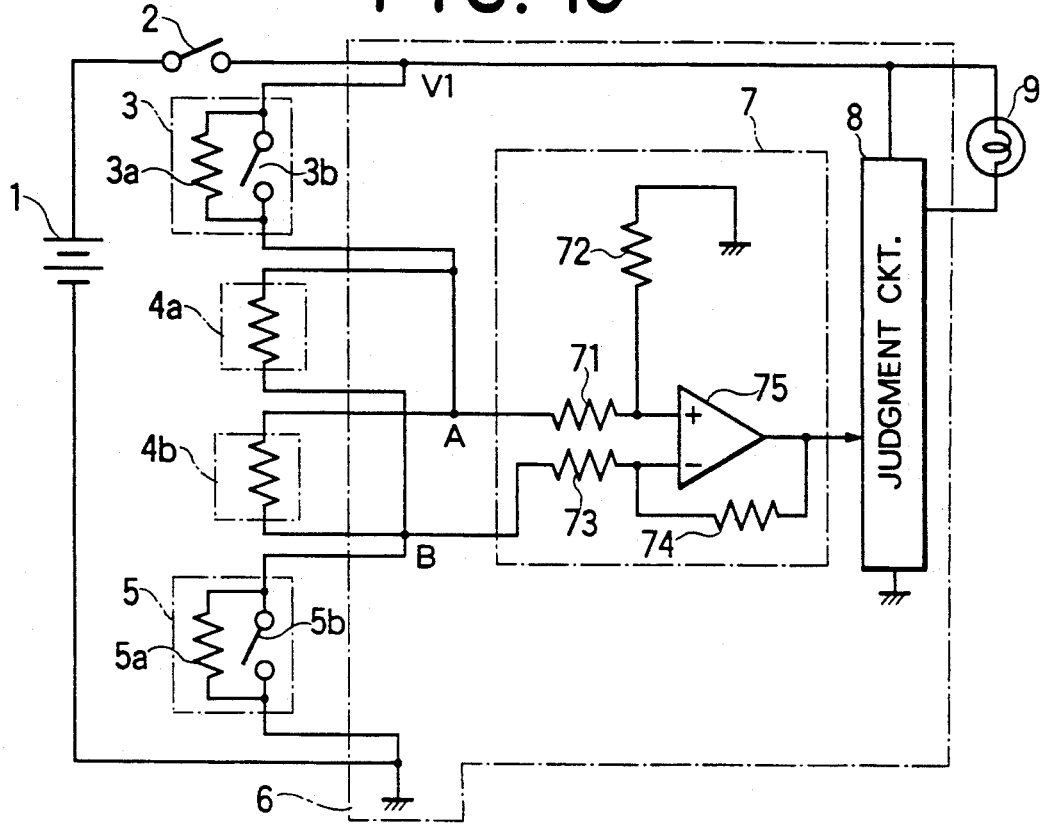
FIG. 10 is a circuit diagram showing a conventional fault detection device for a passenger protection device such as an automotive air bag system.
Figure 11:
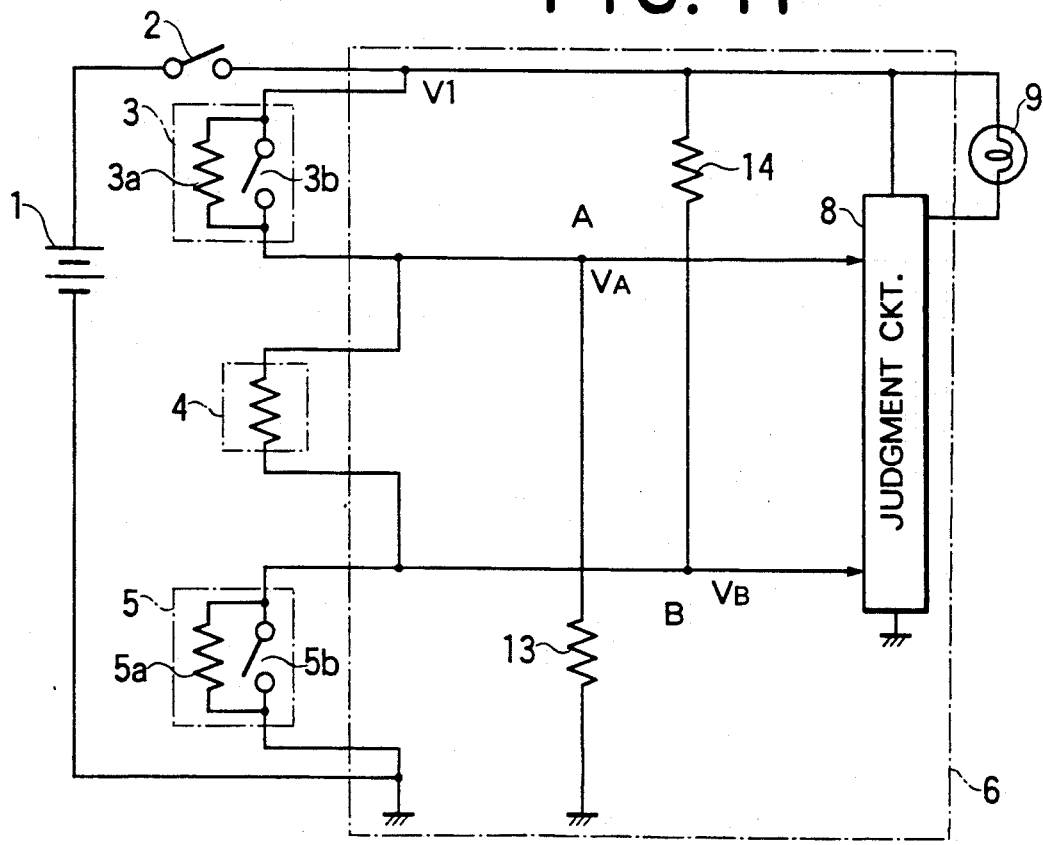
FIG. 11 is a circuit diagram showing a conventional fault detection device for detecting an occurrence of failure of an acceleration sensor of a passenger protection device.

FIG. 1 is a circuit diagram showing an embodiment according to a first aspect of this invention, wherein the parts 1 through 5 and 7 through 9 are similar to those of FIG. 10 described above.

In the case of the circuit of FIG. 1, the fault detection circuit 6 includes, in addition to the differential amplifier 7 and the judgment circuit 8, a diode 10, a resistor 20, a first field effect transistor 30, and a second field effect transistor 31.

The diode 10 is inserted across the respective higher voltage terminals of the squibs 4a and 4b. Namely, the anode of the diode 10 is coupled to the measurement point A, or the higher voltage terminal of the squib 4a. The cathode of the diode 10 is coupled to the measurement point A', or the higher voltage terminal of the squib 4b. Thus, the squib 4a is coupled directly to the acceleration sensor 3 via the measurement point A, while the other squib 4b is coupled to the cathode of the diode 10 via the measurement point A'. As a result, when the normally open contacts 3b and 5b of the acceleration sensors are closed upon collision of the automobile, the diode 10 supplies a starting current simultaneously to the two squibs 4a and 4b.

The resistor 20 is inserted across the positive terminal of the DC power source 1 and a terminal of the squib 4b. The first field effect transistor 30 is inserted across the measurement point A and the resistor 71 of the differential amplifier 7. The second field effect transistor 31 is inserted across the measurement point A' and the resistor 71 of the differential amplifier 7. To the respective gates of the first and the second field effect transistors 30 and 31 are applied control signals from the judgment circuit 8, which consists, for example, of a microcomputer, such that the field effect transistors 30 and 31 are alternately turned on and off. Thus, via the field effect transistors 30 and 31 are applied alternately and selectively to the non-inverting input terminal of the differential amplifier 7 the voltage $V_A$ at the measurement point A and the voltage $V_{A'}$ at the measurement point A' as the voltage $V_X$ at the terminal of the squib 4a or 4b. Further, a voltage $V_B$ at the measurement point B is supplied to the judgment circuit 8.

The operation of the embodiment of FIG. 1 is as follows. As in the above, it is assumed: that the normal resistance of the squibs 4a and 4b is several ohms; that the small voltages developed across the squibs 4a and 4b are less than several tens of millivolts; that the failure is detected on the basis of a voltage variation corresponding to a resistance variation of 1 ohm; and that the resistances of the squibs 4a and 4b vary within a prescribed detection range of 1 ohm.

Provided that the resistance of the resistor 3a of the acceleration sensor 3 and the resistance of the resistor 20 of the fault detection circuit 6 are equal to each other, the voltages at the two terminals of the diode 10 during the time when the normally open contact 3b is open are substantially equal to each other. Then, the diode 10 is turned off, and no current other than a negligible leakage current flows through the diode 10. Thus, distinct monitoring current flow through the squibs 4a and 4b. Namely, there flows through a squib 4a current via the resistor 3a of the acceleration sensor 3, while a current via the resistor 20 of the fault detection circuit 6 flows through the other squib 4b.

Under this circumstance, the judgment circuit 8 alternately turns on and off the first and the second field effect transistors 30 and 31 by means of the gate control signals applied to the gates thereof. Thus the voltages $V_A$ and $V_A'$ at a terminal of the squibs 4a and 4b are applied alternately as the input voltage $V_X$ to the non-inverting input terminal of the operational amplifier 75 via the resistor 71. On the other hand, the voltage $V_B$ at the measurement point B is applied to the inverting input terminal of the operational amplifier 75 via the resistor 73. Thus, the small voltage difference, $V_X - V_B$, developed across the two terminals of the respective squibs 4a and 4b are supplied to the differential amplifier 7 alternately in accordance with the selection signal (gate control signal) of the judgment circuit 8.

The differential amplifier 7 amplifies this small voltage difference applied thereto, and the judgment circuit 8 determines the level of the amplified output voltage $V_0$ of the differential amplifier 7. Further, the judgment circuit 8 determines, by means of a detector (not shown), the voltage, $V_1 - V_B$, across the serial circuit consisting of the acceleration sensor 3 and the squibs 4a and 4b, and detects separately the resistances of the squibs 4a and 4b that are utilized as reference resistance values for the detection of a failure.

Namely, let Rg be the resistance of the resistors 3a and 20; Rs be the resistance of the squibs 4a and 4b; G be the gain of the differential amplifier 7; $V_1$ be the DC power source voltage or the power source side voltage of the acceleration sensor 3; $V_X$ be the non-inverting input terminal voltage of the differential amplifier 7; $V_B$ be the inverting input terminal voltage of the differential amplifier 7; and $V_0$ be the amplified output voltage of the differential amplifier 7. Then, $$V_0 = G(V_X - V_B) \quad (1)$$

$$V_X - V_B = (V_1 - V_B)Rs/(Rg + Rs) \quad (2)$$

Further, since usually, $$Rg \gg Rs$$

it follows from equation (2) that $$V_X - V_B = (V_1 - V_B)Rs/Rg \quad (3)$$

Thus, substituting equation (3) in equation (1), the amplified output voltage $V_0$ of the differential amplifier 7 is given by $$V_0 = G(V_1 - V_B)Rs/Rg \quad (4)$$

It is thus known from equation (4) that an amplified output voltage $V_0$ of the differential amplifier 7 is proportional to the resistance Rs of the squibs 4a and 4b.

By the way, if the resistances of the resistors 71 through 74 are represented by $R_{71}$ through $R_{74}$, the gain G of the differential amplifier 7 is equal to:

$$G = R_{72}/R_{71} = R_{74}/R_{73}$$

The differential amplifier 7 is to amplify the voltage developed across each one of the squibs 4a and 4b to a level that can easily be measured. Thus, the gain of the differential amplifier 7 may be reduced to one half of the gain of the conventional fault detection device of FIG. 10. As a result, the adverse effects of noises are reduced.

Further, when a failure occurs in the acceleration sensor 3 or 5, the judgment circuit 8 can determine the failure of the acceleration sensor 3 or 5 on the basis of the voltage $V_B$ at the measurement point B.

Figures 2, 3:
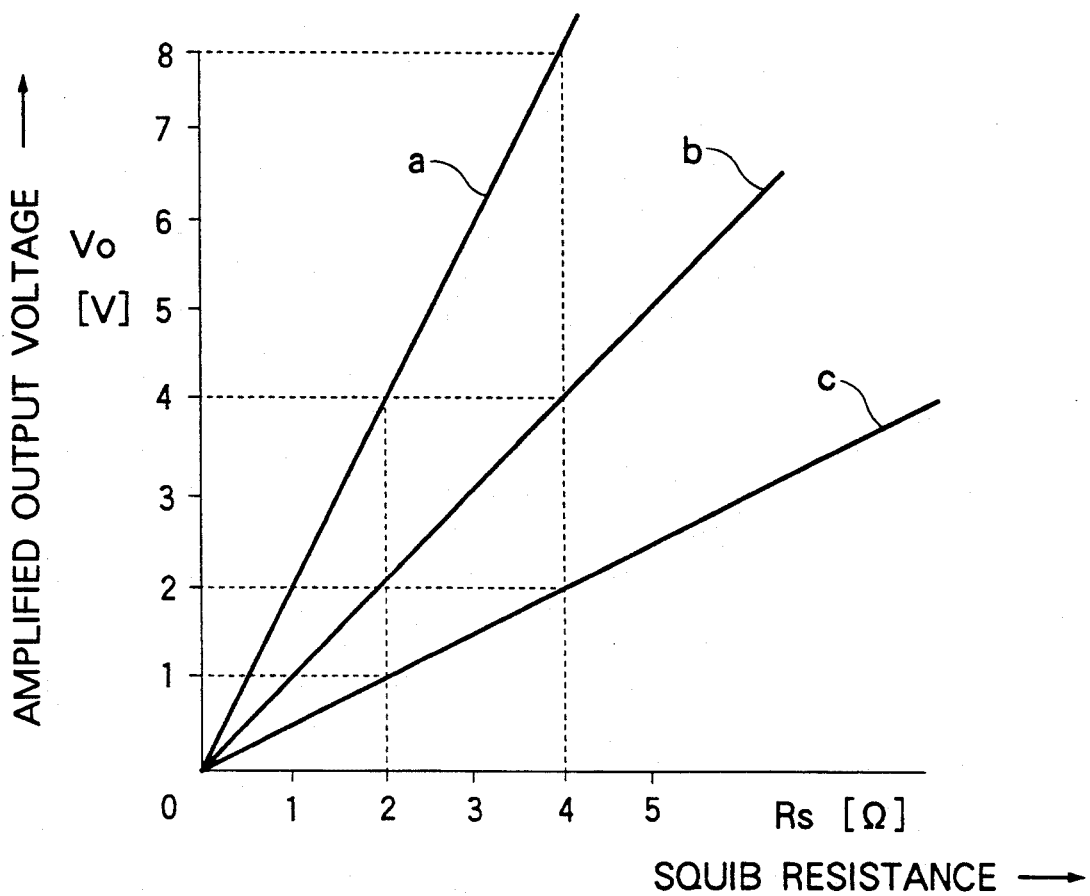
FIG. 2 is a diagram showing the relationships between the squib resistance Rs and the amplified voltage $V_0$ in the fault detection device of FIG. 1.
FIG. 3 is a table showing the variation range of the amplified voltage on the basis of the relationship of FIG. 2.

FIG. 2 is a diagram showing the relationships between the squib resistance Rs and the amplified voltage $V_0$ in the fault detection device of FIG. 1, wherein: the gain G is 100; the resistance Rg of the resistor 3a is 1000 ohms. The curves a, b, c correspond to the cases where the voltage difference, $V_1 - V_B$, is 20 voltages, 10 voltages, and 5 voltages, respectively.

Let it be assumed that the short-circuit and the open-circuit judgment reference values for the squib resistance Rs (whose normal value is 3 ohms) are 2 ohms and 4 ohms, respectively. Then, the amplified output voltage $V_0$ for the respective judgment reference values as determined from FIG. 2 are as set forth in FIG. 3. Usually, electronic circuits including microcomputers are driven at a source voltage of 5 V. Thus, it is desirable that the voltage $V_0$ inputted to the judgment circuit 8 is within the range of 0 to 5 voltages. In this case the amplified voltage $V_0$ varies from 1 to 8 voltages, as shown in FIG. 3.

Figure 4:
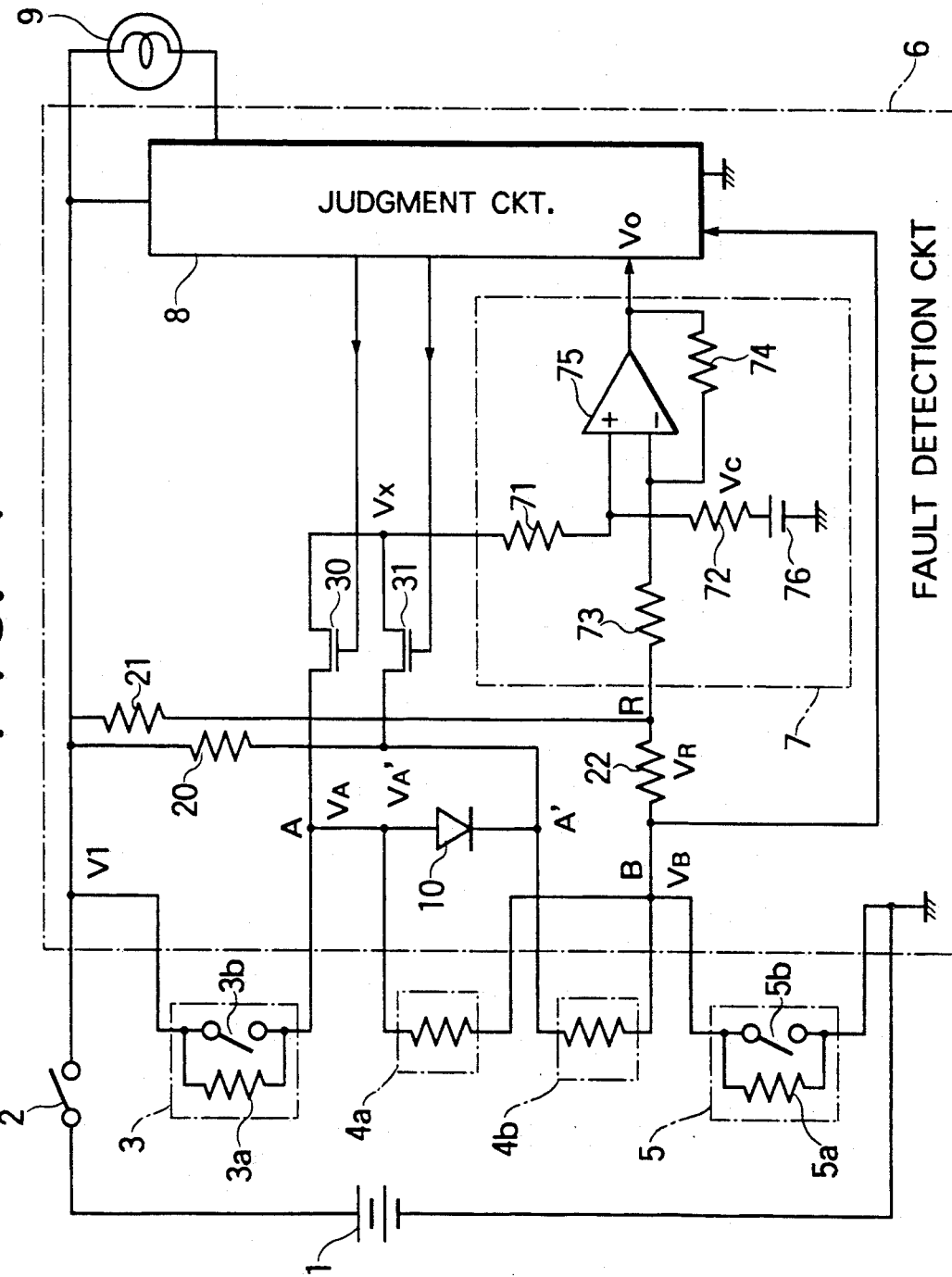
FIG. 4 is a circuit diagram showing an embodiment according to a second aspect of this invention.

Next, referring to FIG. 4, a second embodiment according to this invention utilizing a wheatstone bridge is described.

In FIG. 4, reference resistors 21 and 22 are inserted in series across the positive terminal of the DC power source 1 and the measurement point B. The junction point between the reference resistors 21 and 22, or the measurement point R, is connected to the inverting input terminal of the operational amplifier 75 via the resistor 73.

The resistance ratio of the reference resistors 21 and 22 is set equal to the resistance ratio of the resistances of the resistor 3a and the squib 4a, and the resistance ratio of the resistances of the resistor 20 and the squib 4b. Thus, the reference resistors 21 and 22 constitute, together with the resistor 3a and the squib 4a, or together with the resistor 20 and the squib 4b, a Wheatstone bridge circuit. Further, to the differential amplifier 7 are supplied the voltage $V_X$ at the measurement point A or A', and the voltage $V_R$ at the measurement point R.

A reference voltage source 76 is inserted between the resistor 72 (which is a resistor for adjusting the gain at the non-inverting input terminal side of the operational amplifier 75) and the ground. The voltage $V_C$ of the reference voltage source 76 is set such that the amplified output voltage $V_0$ becomes equal to a predetermined voltage when the difference between the input voltages $V_X$ and $V_R$ to the operational amplifier 75 are null.

Let the resistances of the reference resistors 21 and 22 be $R_{21}$ and $R_{22}$; the normal resistance of the squibs 4a and 4b be Rsc; and the non-inverting input terminal voltage of the differential amplifier 7 be $V_R$; and the reference voltage of the reference voltage source 76 be $V_C$. Then, $$V_0 = G(V_X - V_R) + V_C \quad (5)$$

$$V_X - V_R = (V_1 - V_B) \\ [Rs/(Rg + Rs) - R_{22}/(R_{21} + R_{22})] \quad (6)$$

Since usually $$Rg \gg Rs$$

$$R_{21} >> R_{22}$$

$$Rsc/Rg = R_{22}/R_{21}$$

the following equation is obtained:

$$V_X - V_R = (V_1 - V_B)(Rs/Rg - R_{22}/R_{21}) \tag{7}$$

Substituting equation (7) into equation (5), the amplified output voltage $V_0$ is given by:

$$V_0 = G(V_1 - V_B)(Rs - Rsc)/Rg + V_C \tag{8}$$

From equation (8) it is known that amplified output voltage $V_0$ of the differential amplifier 7 relative to the central value at the reference voltage $V_C$ is proportional to the error of the resistance Rs of the squibs 4a and 4b with respect to the normal resistance Rsc thereof.

Figures 5, 6:
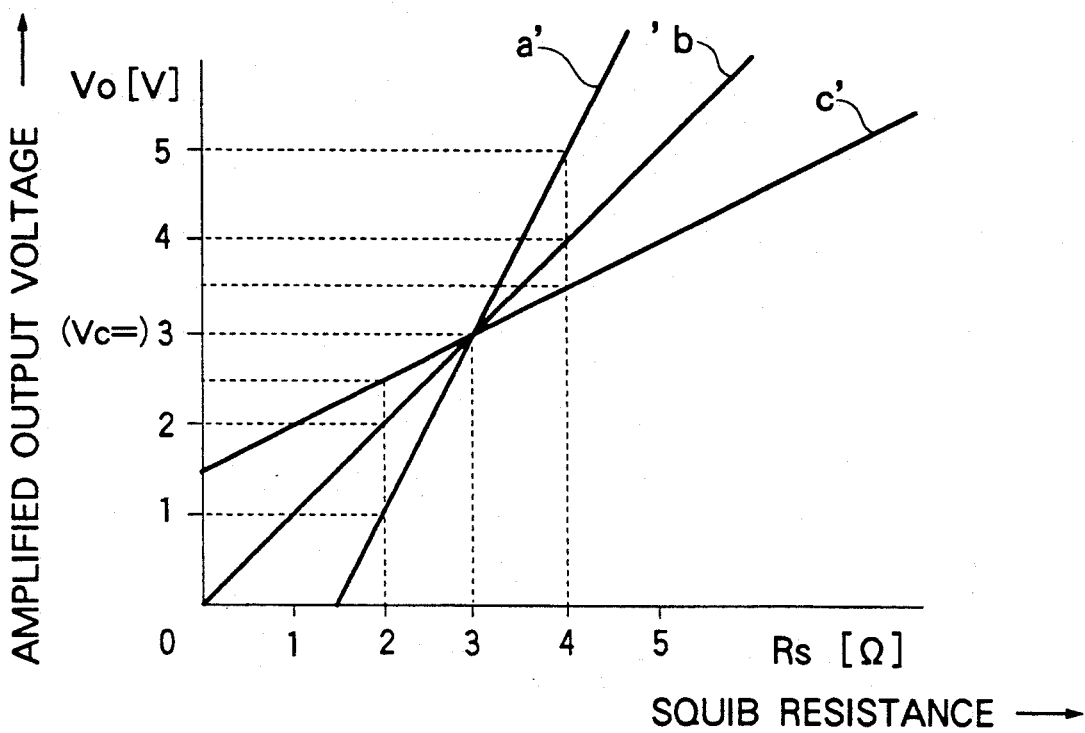
FIG. 5 is a diagram showing the relationships between the squib resistances and the amplified voltage $V_0$ in the fault detection device of FIG. 4.
FIG. 6 is a table showing the variation range of the amplified voltage on the basis of the relationship of FIG. 5.

FIG. 5 is a diagram showing the relationships between the squib resistances and the amplified voltage $V_0$ in the fault detection device of FIG. 4, wherein: the gain G is 100; the resistance Rg of the resistor 3a is 1000 ohms. The curves a', b', c' correspond to the cases where the voltage difference $(V_1 - V_B)$ is 20 voltages, 10 voltages, and 5 voltages, respectively.

In the case of this embodiment, let it be assumed that the normal squib resistance is 3 ohms, the reference voltage $V_C$ is 3 V, and the short-circuit and the open-circuit judgment reference values for the squib resistance Rs (whose normal value is 3 ohms) are 2 ohms and 4 ohms, respectively. Then, the amplified output voltage $V_0$ for the respective judgment reference values as determined from FIG. 5 are as set forth in FIG. 6. Thus, the variation range of the amplified output voltage $V_0$ of the differential amplifier 7 is from 1 to 5 V, which is within the ideal operational voltage range of 0 to 5 V of the judgment circuit 8. Thus, the fault detection device is capable of detecting the failures with an enhanced reliability.

Further, utilizing the Wheatstone bridge, the adverse effects of the variations of the DC power source voltage $V_1$ or the external noises, etc., are reduced, and the accuracy and reliability of failure detection are thus enhanced.

Figure 7:
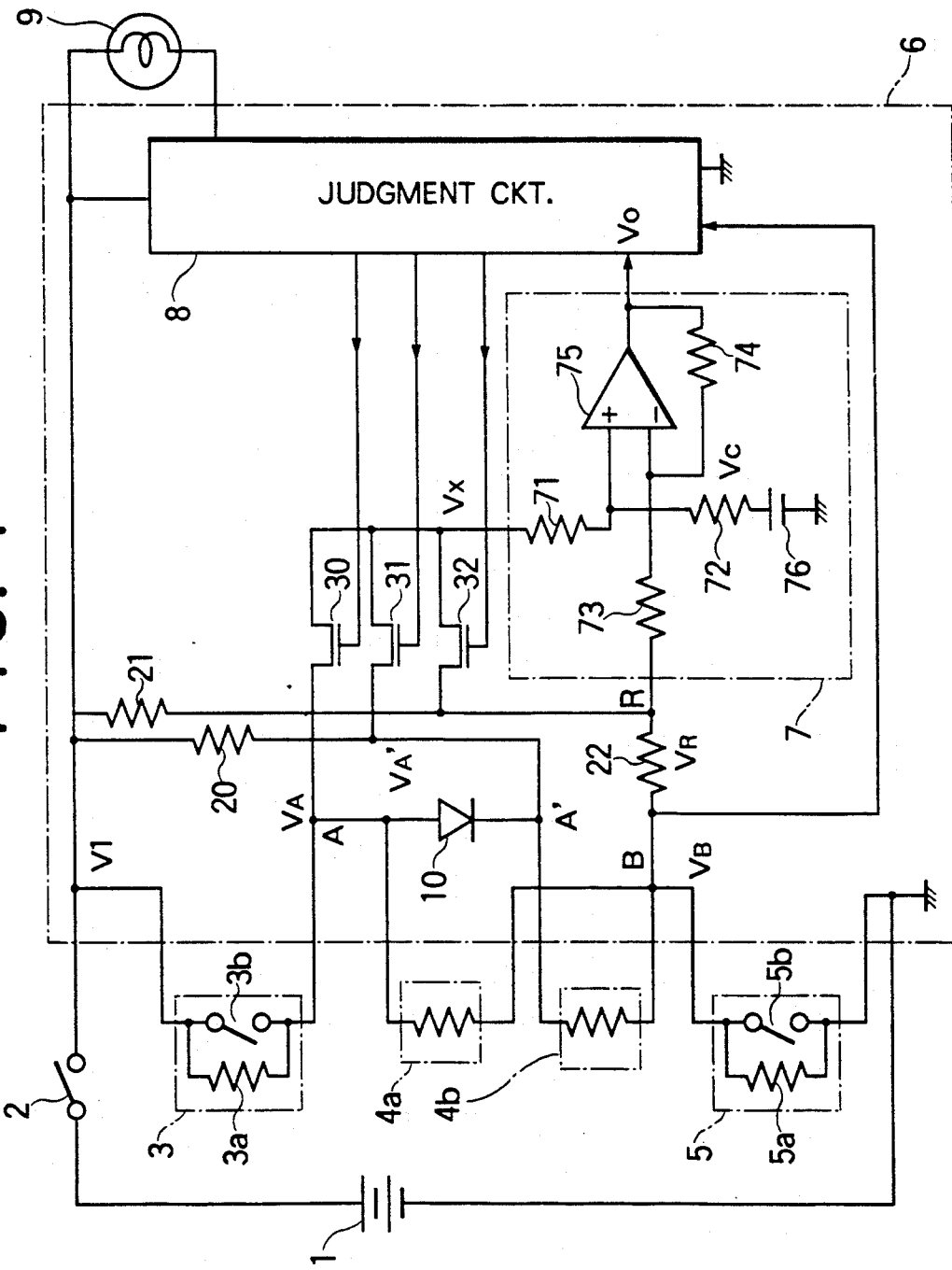
FIG. 7 is a circuit diagram showing an embodiment according to a third aspect of this invention.

FIG. 7 is a circuit diagram showing an embodiment according to a third aspect of this invention, by which the offset component $V_{OF}$ of the amplified output voltage $V_0$ is canceled out. In FIG. 7, a third field effect transistor 32, whose on/off is controlled by the judgment circuit 8, is inserted across the measurement point R and the non-inverting input terminal of the differential amplifier 7.

In the case of this embodiment, the judgment circuit 8 alternately turns on one of the three field effect transistors 30 through 32, and thereby selects one from among the voltages $V_A$, $V_A'$, and $V_R$ at the measurement points A, A', and R as the input voltage $V_X$ of the differential amplifier 7.

Let $V_R$ be the inverting input terminal voltage of the differential amplifier 7; $V_C$ be the reference voltage developed by the reference voltage source 76; $V_{OF}$ be the offset component of the amplified output voltage $V_0$ be; and $V_{01}$ through $V_{03}$ be respectively the amplified output voltage of the differential amplifier 7 at the time when the field effect transistors 30 through 32 are turned on. Then, $V_{01}$ through $V_{03}$ are given by:

$$V_{01} = G(V_A - V_R) + V_C + V_{OF} \tag{9}$$

$$V_{02} = G(V_A' - V_R) + V_C + V_{OF} \tag{10}$$

$$\begin{aligned}V_{03} &= G(V_R - V_R) + V_C + V_{OF} \\ &= V_C + V_{OF}\end{aligned} \tag{11}$$

On the other hand, from the above equation (7), the squib resistance Rs is:

$$Rs = Rsc + Rg(V_X - V_R)/(V_1 - V_B) \tag{12}$$

Thus, the following equation is obtained by taking the difference ((9)−(11)) of the equations (9) and (11):

$$V_{01} - V_{03} = G(V_A - V_R) \tag{13}$$

Likewise, by taking the difference ((10)−(11)) of the equations (10) and (11), the following equation is obtained:

$$V_{02} - V_{03} = G(V_A' - V_R) \tag{14}$$

further, from equations (13) and (14), there are obtained:

$$\begin{aligned}V_X - V_R &= V_A - V_R \\ &= (V_{01} - V_{03})/G\end{aligned}$$

$$\begin{aligned}V_X - V_R &= V_A' - V_R \\ &= (V_{02} - V_{03})/G\end{aligned}$$

Substituting these equations into equation (12) and representing the resistances of the squibs 4a and 4b by $Rs_1$ and $Rs_2$, respectively, the following equations are obtained:

$$Rs_1 = Rsc + Rg(V_{01} - V_{03})/[G(V_1 - V_B)] \tag{15}$$

$$Rs_2 = Rsc + Rg(V_{02} - V_{03})/[G(V_1 - V_B)] \tag{16}$$

Thus, the resistances $Rs_1$ and $Rs_2$ of the squibs 4a and 4b can be calculated by means of the equations (15) and (16). Under this circumstance, the amplified output voltage $V_0$ of the differential amplifier 7 is canceled out via the calculations of the equations (13) and (14), such that only the amplified output voltage components which are proportional to the resistances $Rs_1$ and $Rs_2$ of the squibs 4a and 4b are obtained. Thus, the failure detection for the squibs 4a and 4b is further enhanced in accuracy and reliability.

Figure 8:
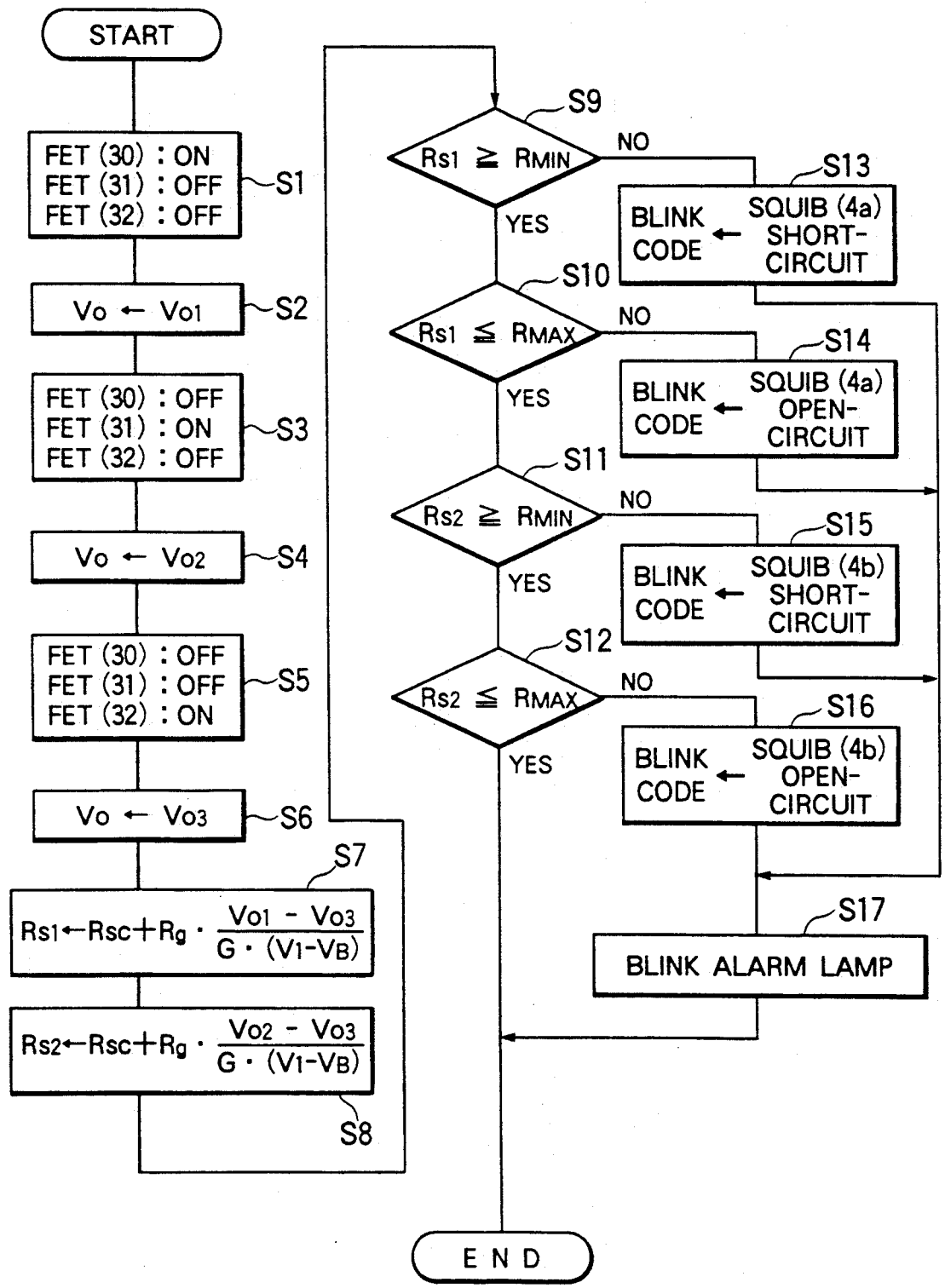
FIG. 8 is a flowchart showing the operations of the judgment circuit of FIG. 7.

FIG. 8 is a flowchart showing the operations of the judgment circuit of FIG. 7. Next, the operations of the judgment circuit 8 is described in greater detail.

First, at step S1, only the first field effect transistor 30 is turned on, the second and the third field effect transistors 31 and 32 being turned off. Next, at step S2, the voltage at a terminal of the squib 4a, namely, the voltage $V_A$ at the measurement point A, is applied on the non-inverting input terminal of the differential amplifier 7, and the first amplified output voltage $V_{01}$ is determined as the amplified output voltage $V_0$. The first amplified output voltage $V_{01}$ is represented by the equation (9) above.

Next, at step S3, only the second field effect transistor 31 is turned on, the first and the third field effect transistors 30 and 32 being turned off. Further, at step S4, the voltage at a terminal of the squib 4b, namely, the voltage $V_A'$ at the measurement point A', is applied on the non-inverting input terminal of the differential amplifier 7, and the second amplified output voltage $V_{02}$ is determined as the amplified output voltage $V_0$. The second amplified output voltage $V_{02}$ is represented by the equation (10) above.

Likewise, at step S5, only the third field effect transistor 32 is turned on, the first and the second field effect transistors 30 and 31 being turned off. At step S6, the voltage $V_R$ at the measurement point R, is applied on the non-inverting input terminal of the differential amplifier 7, and the third amplified output voltage $V_{03}$ is determined as the amplified output voltage $V_0$. The third amplified output voltage $V_{03}$ is represented by the equation (11) above.

Next at step S7, the resistance $Rs_1$ of the first squib 4a is calculated via the equation (15). Further, at step S8, the resistance $Rs_2$ of the other squib 4b is calculated via the equation (16).

Thereafter, the failures of the squibs 4a and 4b are judged on the basis of the squib resistances $Rs_1$ and $Rs_2$ as calculated as above and on the basis of the short-circuit judgment reference level $R_{MIN}$ (which is equal to 2 ohms) and the open-circuit judgment reference level $R_{MAX}$ (which is equal to 4 ohms).

Namely, at step S9, it is judged whether or not the $Rs_1$ calculated with respect to the squib 4a is above or equal to the short-circuit judgment reference resistance $R_{MIN}$. If the judgment is affirmative:

$$Rs_1 \geq R_{MIN}$$

it is judged at step S10 whether or not the $Rs_1$ is below or equal to the open-circuit judgment reference resistance $R_{MAX}$. if the judgment is affirmative at step S10:

$$Rs_1 \leq R_{MAX}$$

it is determined that the squib 4a is normal.

Next, at step S11, it is judged whether or not the $Rs_2$ calculated with respect to the squib 4b is above or equal to the short-circuit judgment reference resistance $R_{MIN}$. If the judgment is affirmative:

$$Rs_2 \geq R_{MIN}$$

it is judged at step S12 whether or not the $Rs_2$ is below or equal to the open-circuit judgment reference resistance $R_{MAX}$. if the judgment is affirmative at step S12:

$$R_{S1} \leq R_{MAX}$$

it is determined that the squib 4b is normal, and the measurement/calculation/judgment routine of FIG. 8 is terminated.

On the other hand, when the resistance $R_{S1}$ or $R_{S2}$ are judged at step S9 through S12 to be outside of the allowable range as specified by the reference resistances $R_{MIN}$ and $R_{MAX}$, the blink codes indicating the failures of respective squibs 4a and 4b are set at step S13 through S16. Further, at step S17, the alarm lamp 9 is blinked in accordance with the blink code, thereby terminating the judgement routine.

Namely, if it is judged at step S9 that $$RS_1 < R_{MIN}$$

the blink code indicating that the squib 4a is short-circuited is set at step S13. Further, if it is judged at step S10 that $$RS_1 > R_{MAX}$$

the blink code indicating that the squib 4a is in an open-circuit state is set at step S14.

Furthermore, if it is judged at step S11 that $$RS_2 < R_{MIN}$$

the blink code indicating that the squib 4b is short-circuited is set at step S15. If it is judged at step S12 that $$RS_2 > R_{MAX}$$

the blink code indicating that the squib 4b is in an open-circuit state is set at step S16.

As described above, the short-circuit or open-circuit failure of the squibs 4a and 4b can be detected individually and separately. The individual failure detection operation of the plurality of squibs via the judgment circuit 8 in the case of the fault detection devices of FIGS. 1 and 4 is similar to that described above, except that the calculation methods for the respective squib resistances are different.

Figure 9:
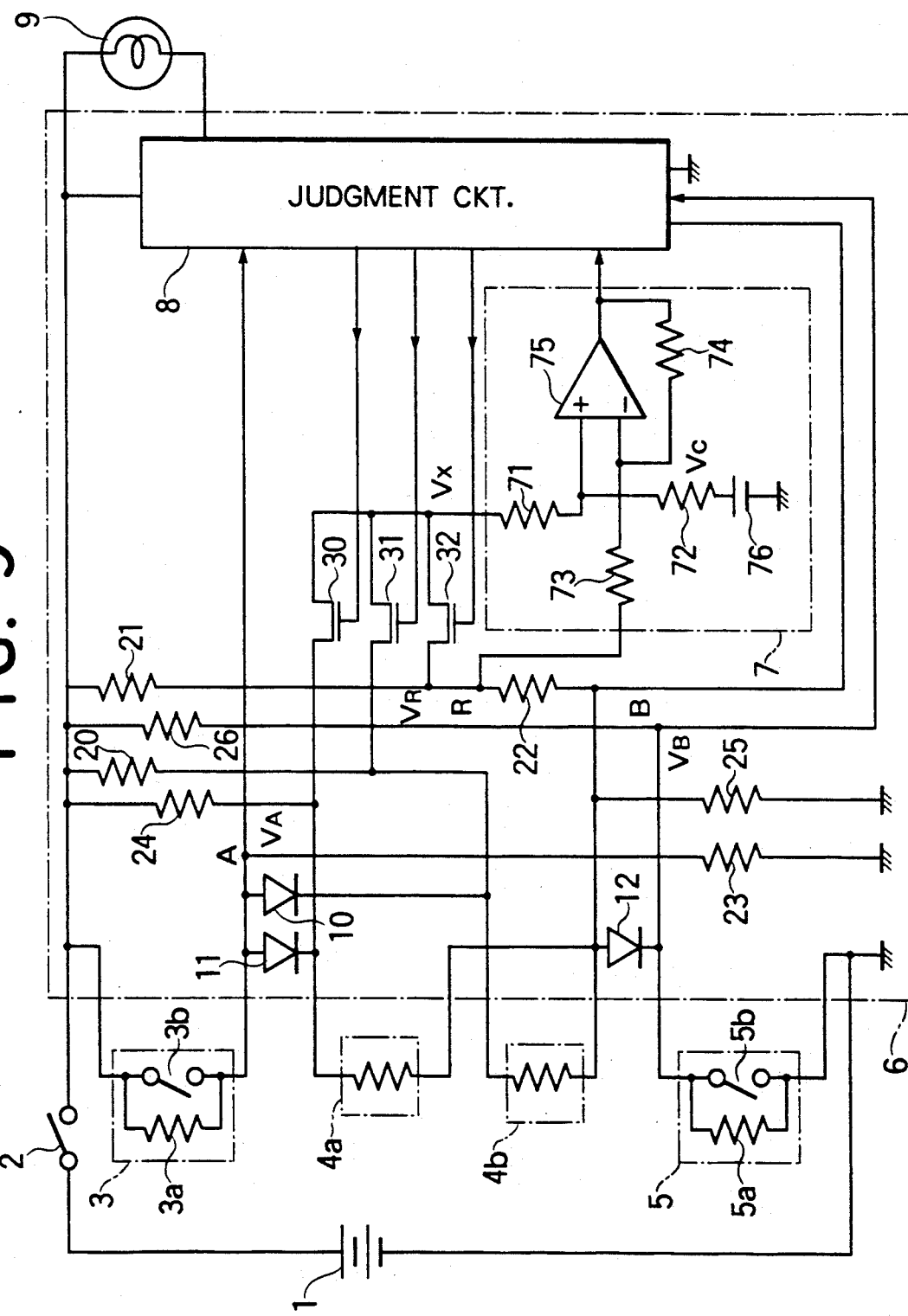
FIG. 9 is a circuit diagram showing an embodiment according to a fourth aspect of this invention.

FIG. 9 is a circuit diagram showing an embodiment according to a fourth aspect of this invention, by which the failures of the acceleration sensors 3 and 5 can be detected separately and individually.

In the case of this embodiment, not only the amplified output voltage $V_0$ of the differential amplifier 7, but also the $V_A$ and $V_B$ at the junctions A and B, are directly inputted to the judgement circuit 8. Further, the fault detection circuit 6 includes the diodes 11 and 12 and the resistors 23 through 26, in addition to the parts that correspond to those of FIG. 7.

The diode 11 is inserted across the acceleration sensor 3 and the squib 4a. The anode of the diode 11 is coupled to the measurement point A, while the cathode thereof is coupled to the higher voltage terminal of the squib 4a. The diode 12 is inserted across the squib 4b and the acceleration sensor 5. The anode of the diode 12 is coupled to the lower voltage terminal of the squib 4b, while the cathode thereof is coupled to the measurement point B.

The resistor 23 is inserted across the measurement point A and the ground. The resistor 24 is inserted across the positive terminal of the DC power source 1 and the measurement point A. The resistor 25 is inserted across the lower voltage terminal of the squib 4b and the ground. The resistor 26 is inserted across the positive terminal of the DC power source 1 and the measurement point B.

The resistor 3a of the acceleration sensor 3 and the resistors 20, 24, and 26 are set at the same resistance value. Further the resistor 5a of the acceleration sensor 5 and the resistors 23 and 25 are set at the same resistance value.

In the case of this embodiment, during the time when the normally open contacts 3b and 5b of the acceleration sensors 3 and 5 are open, the voltages at the two terminals of the respective diodes 10, 11, and 12 are substantially equal to each other, and hence there does not flow any current therethrough. The monitoring currents through the acceleration sensors 3 and 5 and the squibs 4a and 4b flow via distinct and separate paths.

As a result, on the basis of the determination of the voltage $V_A$ at the measurement point A at the lower voltage terminal of the acceleration sensor 3 and of the voltage $V_B$ at the measurement point B of the higher voltage terminal of the acceleration sensor 5, the judgement circuit 8 detects the failures of the respective acceleration sensors 3 and 5. In particular, when the resistances across the respective two terminals of the acceleration sensors 3 and 5 are large, the diodes 10 through 12 are biased in reverse direction. Thus, the open-circuit failures or disconnections of the acceleration sensors 3 and 5 can be detected reliably and individually.

Further, since the structure of the circuit is identical to that of the embodiment of FIG. 7 in other respects, the failures of the squibs 4a and 4b can also be detected individually and reliably.

In the case of the above embodiments, the field effect transistors 30 through 32 are utilized as the switching means for selecting the input voltage $V_X$ for the differential amplifier 7. However, other switching means may be utilized in their stead provided that they have an equivalent switching function. Furthermore, in the above embodiments, the judgment circuit 8 controls the on/off of the field effect transistors 30 through 32. However, the on/off the field effect transistors may be controlled by means of other timing or clock signal generation means. Still further, in the above embodiments, the number of squibs and that of the acceleration sensors are two. However, this invention may be applied to fault detection devices where the number of the squibs and that of the acceleration sensors are three or more.

What is claimed is:

1. A fault detection device for an automotive passenger protection device, comprising:
   a DC power source;
   first and second starting means, each including a resistor, coupled in parallel circuit relationship to each other, said first and second starting means being coupled across said DC power source;
   at least one acceleration sensor coupled in series with said first and second starting means and including a first resistor having a resistance greater than a resistance of each of said resistors of said first and second starting means; and a normally open contact coupled in parallel with said first resistor; wherein said normally open contact is closed upon detection of an impulse above a predetermined magnitude, thereby supplying a current above a predetermined level from said DC power source to said first and second starting means to start a passenger protection device;
   a differential amplifier having a non-inverting input terminal and an inverting input terminal coupled across said first and second starting means;
   a judgment circuit means coupled to an output of said differential amplifier for determining an occurrence of failure of said first and second starting means on the basis of an amplified output voltage of said differential amplifier;
   a diode having an anode and a cathode coupled across respective higher voltage terminals of said first and second starting means;
   a second resistor having a resistance equal to the resistance of said first resistor, said second resistor being inserted across a positive terminal of said DC power source and the cathode of said diode;
   first and second switching means inserted respectively between the respective higher voltage terminals of said first and second starting means and the non-inverting input terminal of said differential amplifier; and
   means for alternately turning on said first and second switching means, such that the non-inverting input terminal of said differential amplifier is supplied alternately with a voltage from said respective higher voltage terminals of said first and second starting means.

2. A fault detection device for a passenger protection device as claimed in claim 1, further comprising:
   a first and a second reference resistor coupled in series across the positive terminal of said DC power source and lower voltage terminals of said first and second starting means, said first and second reference resistors having a resistance ratio equal to a resistance ratio of the resistance of said first resistor and a resistance of each of said resistors of said first and second starting means, a junction point between said first and second reference resistors being coupled to the inverting input terminal of said differential amplifier;
   wherein said differential amplifier includes an operational amplifier and a reference voltage source means coupled across the non-inverting input terminal of said operational amplifier and a ground, such that an amplified output voltage of said differential amplifier is equal to a predetermined reference voltage when input voltage difference across the non-inverting input terminal and the inverting input terminal of said differential amplifier is null.

3. A fault detection device for a passenger protection device as claimed in claim 2, further comprising:
   third switching means inserted across said junction point between said first and second reference resistors and the non-inverting input terminal of said differential amplifier; and
   said means for alternately turning on said first and second switching means also turning on said third switching means, such that said first, second and third switching means are turned on successively at distinct timings;
   wherein said judgment circuit means includes means for canceling out an offset component on the basis of said amplified output voltage of said differential amplifier outputted when said third switching means is turned on.

4. A fault detection device for a passenger protection device as claimed in claim 3, comprising at least two acceleration sensors coupled in series with said first and second starting means, a first of said two acceleration sensors, said first and second starting means, and a second of said acceleration sensors being coupled in series across the positive terminal and the negative terminal of said DC power source in order;
   said fault detection device further comprising:
   a second diode inserted in a forward polarity between a lower voltage terminal of said first acceleration sensor and a higher voltage terminal of said first starting means;
   a third diode inserted in a forward polarity between a lower voltage terminal of said first and second starting means and the negative terminal of said DC power source;

a first pair of resistors each having a resistance equal to a resistance of a resistor of said first acceleration sensor and inserted respectively across a cathode of said second and third diodes and the positive terminal of said DC power source;

a second pair of resistors each having a resistance equal to a resistance of a resistor of said second acceleration sensor and inserted respectively across an anode of said second and third diodes and the negative terminal of said DC power source;

wherein said judgment circuit means is supplied with a first measurement point voltage at the anode of said second diode and with a second measurement point voltage at the cathode of said third diode such that an occurrence of failure of said first and second acceleration sensors are detected individually on the basis of said first and second measurement point voltages.

* * * * *